(12) United States Patent
Oikawa

(10) Patent No.: US 6,514,872 B1
(45) Date of Patent: Feb. 4, 2003

(54) METHOD OF MANUFACTURING A SEMICONDUCTOR DEVICE

(75) Inventor: Hirokazu Oikawa, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 09/680,314

(22) Filed: Oct. 6, 2000

(30) Foreign Application Priority Data

Oct. 7, 1999 (JP) .......................................... 11-286232

(51) Int. Cl.[7] ................. H01L 21/3065; H01L 21/311
(52) U.S. Cl. ...................................... 438/725; 438/623
(58) Field of Search .................... 438/725, FOR 132, 438/FOR 133, 623, FOR 355, FOR 389

(56) References Cited

FOREIGN PATENT DOCUMENTS

| JP | 64-76723 | * | 3/1989 |
|----|----------|---|--------|
| JP | 8-162441 | * | 6/1996 |
| JP | 8-181087 |   | 7/1996 |
| JP | 8-316209 |   | 11/1996 |
| JP | 9-97797  | * | 4/1997 |
| JP | 10-242274 |  | 9/1998 |
| JP | 10-289952 |  | 10/1998 |
| JP | 11-214371 |  | 8/1999 |

OTHER PUBLICATIONS

Michael Schier, "Reactive Ion Etching of Benzocyclobutene Using a Silicon Nitride Dielectric Etch Mask", J. Electrochem. Soc., vol. 142, No. 9, Sep. 1995, pp. 3238–3240.

* cited by examiner

Primary Examiner—George Fourson
(74) Attorney, Agent, or Firm—McGinn & Gibb, PLLC

(57) ABSTRACT

Lower metal wiring is formed on a base insulating film. A BCB film which is formed of a BCB (benzocyclobutene) resin is formed on the base insulating film and metal wiring. A $SiO_2$ film is formed on the BCB film. A resist film is formed on the $SiO_2$ film, and patterned using a lithography technique. The $SiO_2$ film is etched using the resist film as a mask. The BCB film is anisotropically etched with a mixture of $Cl_2/BCl_3/O_2$ using the $SiO_2$ film as a mask, thereby to form a contact hole. The contact hole is filled with a conductor, thereby forming upper metal wiring.

15 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device with high reliability, and, more particularly, to a method of manufacturing a semiconductor device which includes a wiring layer having satisfactory contact characteristics.

2. Description of the Related Art

In recent years, in order to achieve high integration of integrated circuits, wiring layers have been miniaturized and more layers have been formed in the integrated circuits. In a semiconductor device having the above structure, an increase in the wiring capacitance problematically occurs. Such an increase in the wiring capacitance causes an increase in signal delay between wiring layers.

In one method for reducing the wiring capacitance, a material having low relative permittivity is employed as an interlayer insulating film. An organic insulating film which is formed of a BCB (Benzocyclobutene) resin serves as an insulating film having low permittivity. A BCB film is formed of a resin in which a precursor monomer having the structure illustrated in FIG. 4 is polymerized. The relative permittivity of the BCB film is approximately 2.8 which is quite low.

In the case where a contact hole is formed in the interlayer insulating film which is formed of an organic insulating film such as a BCB film, etc., it is necessary to form a minute opening in a thick interlayer insulating film with high accuracy. Thus, an etching technique, for etching the organic film without forming tapered side wall in the contact hole, is needed for etching the organic film with high anisotropy.

Such an etching method is disclosed, for example, in Unexamined Japanese Patent Application KOKAI Publication No. H2-244625. In this etching method, a mixture of $Cl_2/O_2$ is employed as an etching gas, and an organic insulating film (resist film) is anisotropically etched using an RIE (Reactive Ion Etching) technique while using an SOG (Spin On Glass) film as a mask.

Another etching method for etching an organic film, especially the BCB film, is the one disclosed in M. Schier, J. Electrochem. Soc., Vol. 142, No. 9, September 1995 (pp. 3238–3240). In this method, a mixture of $CF_4/O_2$ or $SF_6/O_2$ is used as an etching gas, and the BCB film is anisotropically etched using an RIE technique with a SiN or $SiO_2$ film as a mask. A method for etching the BCB film using a mixture of $CF_4/O_2$ or a mixture of $SF_6/O_2$ is disclosed in Unexamined Japanese Patent Application KOKAI Publication No. H8-181087.

In the case where an organic insulating film is etched using a mixture of $Cl_2/O_2$, an etching selective ratio (ratio of etching rates) of an SOG film (for example, $SiO_2$) to a resist film is sufficiently large. However, in the case where a BCB film is used in place of a resist film, an etching selective ratio of an organic insulating film to the BCB film is small. Therefore, the etching of the BCB film under high anisotropy can not satisfactorily be achieved, because the width of an opening get broadened during an etching process.

In the case where the BCB film is etched using a mixture of $CF_4/O_2$ or a mixture of $SF_6/O_2$, an etching selective ratio of a SiN film serving as an etching mask to the BCB film is not big enough, thus the processing accuracy of the etching is low.

By increasing the percentage of $O_2$ in the etching gas, the etching selective ratio of the BCB film to the mask can be increased. However, the increase in the percentage of $O_2$ within the etching gas brings a disadvantage that the side wall of a contact hole which is formed during the etching gets roughened.

The low anisotropy or low processing accuracy in the etching of the organic insulating film, such as a BCB film, etc., lowers the contact characteristics of a wiring layer to be formed. This results in low reliability of a semiconductor device including an organic insulating film.

SUMMARY OF THE INVENTION

It is accordingly an object of the present invention to provide a method of manufacturing a semiconductor device with high reliability, and, more particularly, to a method of manufacturing a semiconductor device including a wiring layer which has preferable contact characteristics.

Another object thereof is to provide a method of manufacturing a semiconductor device including a BCB film having a contact hole obtained by etching the BCB film under high anisotropy.

In order to achieve the objects, there is provided a method of manufacturing a semiconductor device, comprising:

forming an organic insulating film on a substrate;

forming a mask on the organic insulating film; and etching the organic insulating film through the mask so as to form a hole, using an etching gas including $Cl_2$, $BCl_3$ and $O_2$.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

FIRST EMBODIMENT

FIGS. 1A to 1D are cross sectional views showing, in sequential order, processes for manufacturing a semiconductor device according to the first embodiment of the present invention.

A base insulating film 11 is formed on a substrate (not illustrated) on which one predetermined functional device is formed. Lower metal wiring 12 is formed in a predetermined area on the base insulating film 11. The base insulating film 11 and the lower metal wiring 12 are coated with a liquid of the precursor monomer of a BCB resin in a thickness of 5 $\mu$m with a spin coating technique. Then, the BCB resin is pre-baked at a temperature of 80° C., and baked for 20 to 30 minutes at a temperature of 300° C. In this heat treatment, the precursor monomer undergoes ring-opening polymerization, thereby forming a BCB film 13. The thickness of the BCB film 13 is not much reduced during the above process.

Figure 1A:
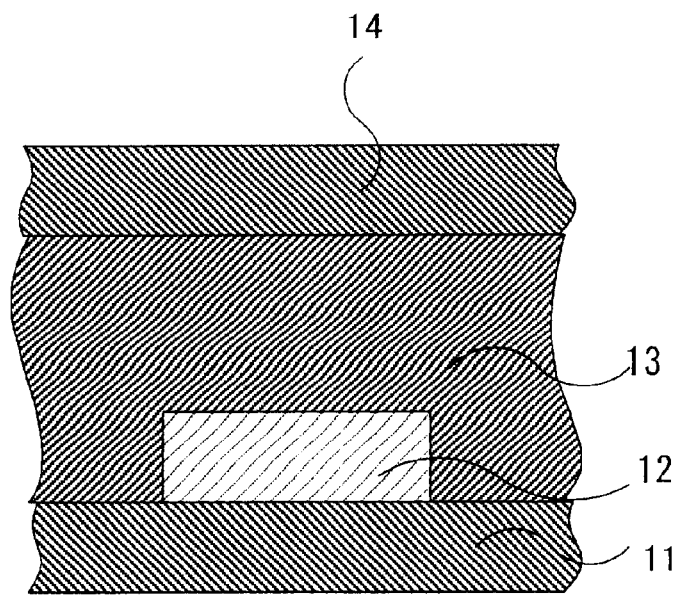
FIGS. 1A to 1D are diagrams showing, in sequential order, processes for manufacturing a semiconductor device according to the first embodiment of the present invention.

Next, as illustrated in FIG. 1A, a $SiO_2$ film which is approximately 0.3 µm in thickness is formed using a plasma CVD (Chemical Vapor Deposition) technique or a spin coating technique. Subsequently, a resist film 15 which is 1 µm in thickness is formed on the $SiO_2$ film 14, and patterned using a photolithography technique.

Figure 1B:
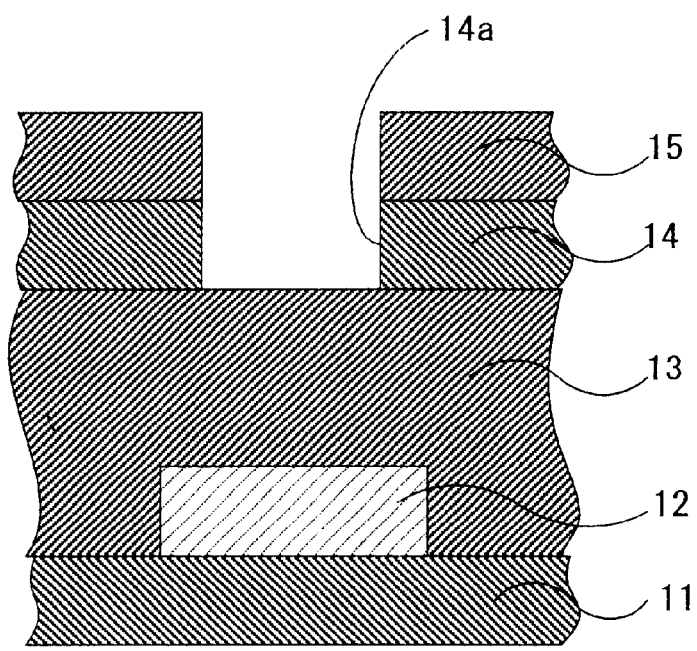

Thereafter, the $SiO_2$ film 14 is selectively etched with an RIE (Reactive Ion Etching) technique using a mixture of $CF_4/CHF_3/Ar$. As a result of this, an opening 14a is formed as illustrated in FIG. 1B.

Figure 1C:
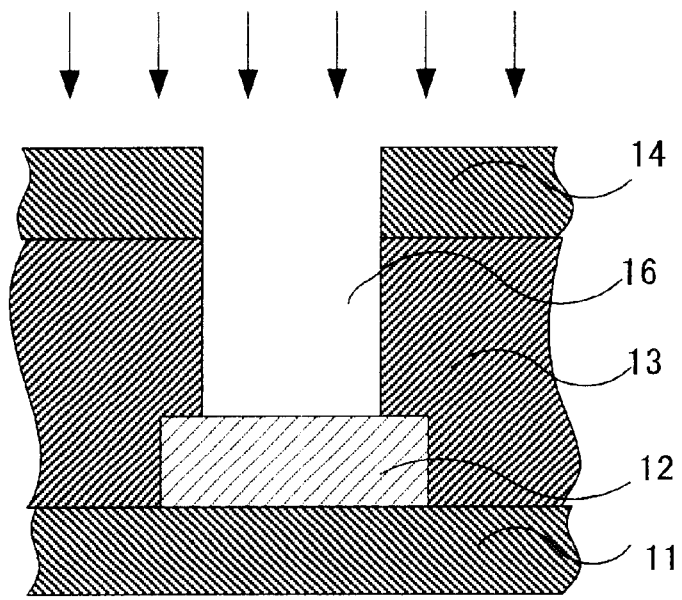

Then, the BCB film 13 is anisotropically etched using a mixture of $Cl_2/BCl_3/)O_2$ while using as a mask the $SiO_2$ film 14 having the opening 14a, thereby to form a contact hole 16 as shown in FIG. 1C. The BCB film 13 and the resist film 15 are etched at substantially the same etching rate, thus the resist film 15 is removed therefrom in a dry etching process.

The opening 14a is formed of a conductive material which is etched at an etching rate of at least 30 nm/min against a $BCl_3$ gas ratio in the range of 0–30 percent.

Figure 1D:
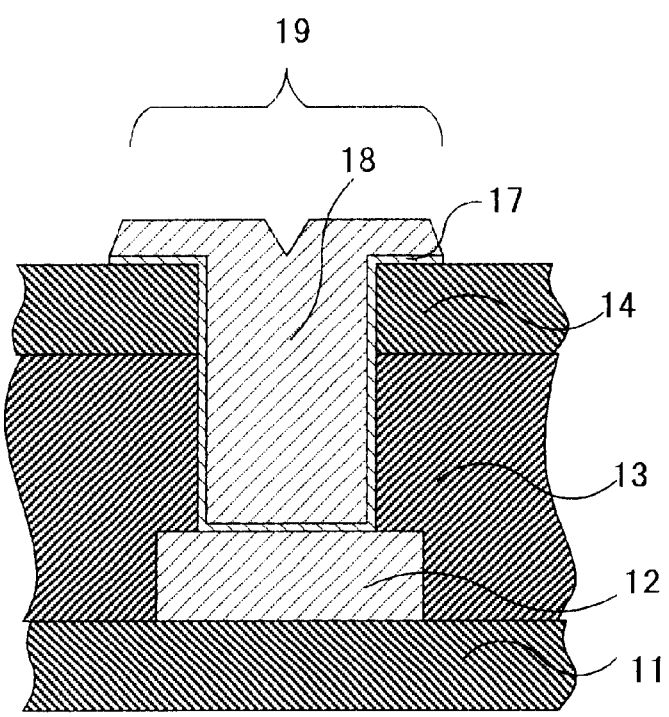

After this, Ti, Pt and Au are sequentially sputtered on the entire surface of the substrate in a thickness of 25 nm, 25 nm and 100 nm, respectively, so as to form a contact metal layer 17 of Ti/Pt/Au. Then, the resultant substrate is coated with resist, except a predetermined upper metal wiring formation area corresponding to the contact hole 16 and upper metal wiring 19, as will be explained later. An Au layer 18 is formed in a thickness 3 µm using an electrolytic plating technique. Then, the resist is removed therefrom using an organic solvent. A part of the contact metal layer 17 which is formed on the $SiO_2$ film 14 is removed therefrom using an ion milling technique, while using the Au layer 18 as a mask. Having performed the so-far described processes, upper metal wiring 19 is formed which wiring includes the contact metal layer 17 and the Au layer 18 and is connected to the lower metal wiring 12 via the contact hole 16, as illustrated in FIG. 1D.

Explanations will now be made to etching conditions under which the above-described BCB film 13 is etched.

Dry etching of the BCB film 13 is processed in an ICP (Inductive Coupled Plasma) reactive furnace. The conditions under which the BCB film 13 dry-etched are that: a gas flow ratio of components of an etching gas, i.e. $Cl_2/BCl_3/O_2$, is 20/10/30 sccm; the gas pressure is 2.25 mTorr (which is equivalent to 0.3 Pa); the antenna power is 400W; and the RF bias power is 200W.

Figure 2A:
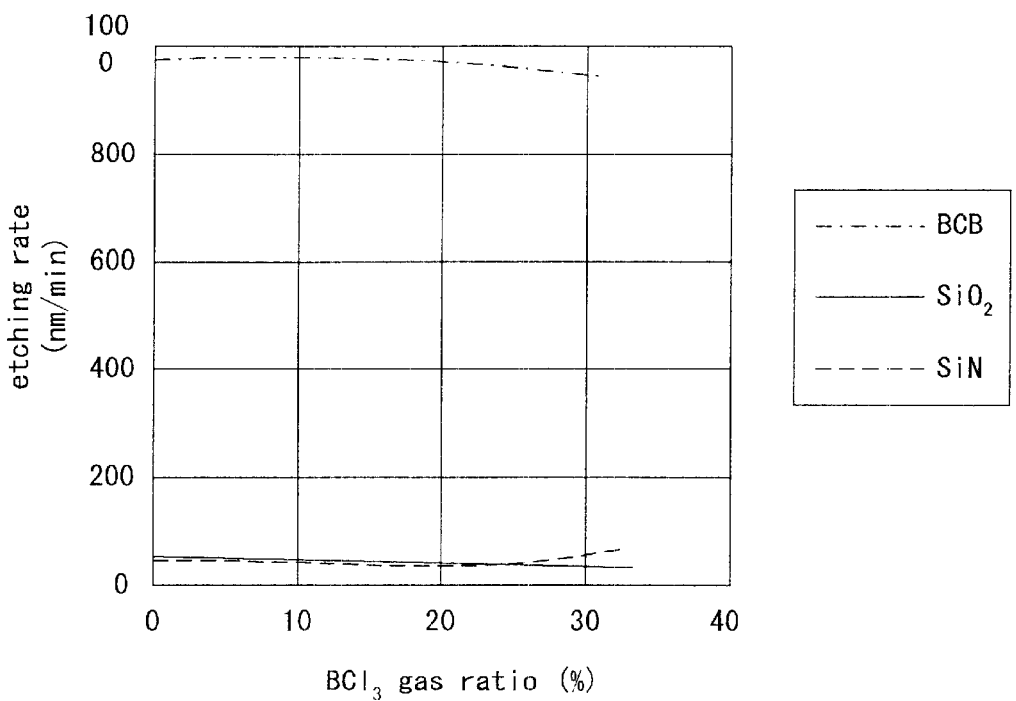
FIGS. 2A and 2B are graphs showing an etching rate and an etching selective ratio of an etching gas to be employed for manufacturing the semiconductor device, respectively.
Figure 2B:
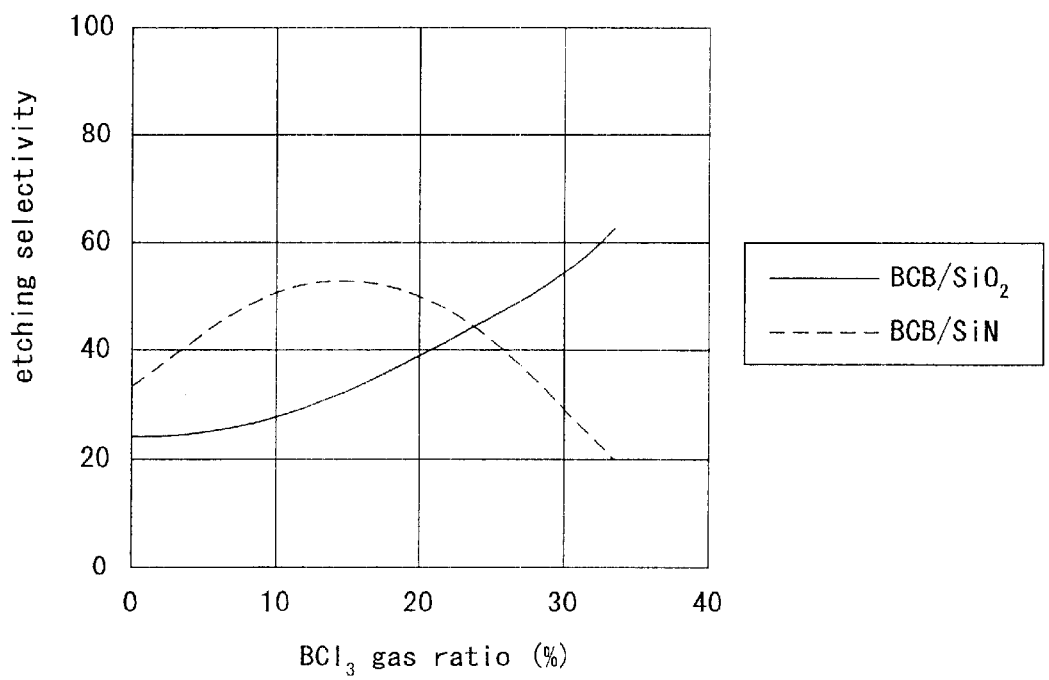

FIGS. 2A and 2B illustrate the etching characteristics of etching performed under etching conditions where a mixing ratio of the etching gas differs from that of the above-described conditions.

FIG. 2A is a graph showing $BCl_3$ percentage dependency of an etching rate for each base film of BCB, $SiO_2$ and SiN. As shown in FIG. 2A, the etching rate of a BCB film by the etching gas containing $BCl_3$ is much higher than that of base films of $SiO_2$ and SiN. It shows that the gas containing $BCl_3$ can etch a BCB film over a mask of $SiO_2$ or SiN with good etching selectivity.

FIG. 2B is a graph showing $BCl_3$ percentage dependency of an etching selective ratio based on the data shown in FIG. 2A. It can be understood that the etching selective ratio (BCB film/$SiO_2$, BCB film/SiN) increases, by appropriately adding $BCl_3$ to a mixture of $C_2/O_2$.

In the case where the etching selective ratio is equal to or larger than 40, a generally preferable etching profile can generally be obtained. As seen from FIG. 2, it is preferable that the volume percentage of $BCl_3$ is equal to or larger than 20% in the case where to use a $SiO_2$ film as a mask, and is in a range between 5% and 25% in the case where to use a SiN film as a mask. When to use a SiN film as a mask, the maximum selective ratio can be obtained if the percentage of the $BCl_3$ in the etching gas is 15%.

From experience, it is preferable that the percentage of $BCl_3$ is equal to or lower than 80% in the total flow amount of etching gas. If the percentage of $BCl_3$ is equal to or larger than 80%, the percentage of $O_2$ extremely decreases, resulting in a decrease in the etching selective ratio. Thus, it is preferable that the percentage of $BCl_3$ is in a range between 5% and 80% within the total flow amount of etching gas.

It is also preferred that the percentage of $O_2$ is in a range between 20% and 85% within the total flow amount of etching gas. If the percentage of $O_2$ is equal to or larger than 20%, an oxide film, such as $B_2O_3$, is formed on the surface of an insulating film during an etching process, and a high selective ratio of the insulating film to the BCB film can be obtained. In the case where the percentage of $O_2$ is high in the etching gas, the BCB film is side-etched, thus the percentage of $O_2$ is preferably equal to or smaller than 85% in the entire flow amount of etching gas. Specifically, the percentage of $O_2$ should be in a range between 20% and 85% in the total flow amount of etching gas. It is preferable that the percentage of $Cl_2$ is in a range between 10% and 80% in the total flow amount of etching gas.

As explained above, according to the method of manufacturing a semiconductor device according to the first embodiment, a mixture of $Cl_2/BCl_3/O_2$ is employed as an etching gas. In this structure, an etching process under high anisotropy can be achieved, thereby forming a minute contact hole in an organic insulating film which is formed of a BCB resin, etc.

SECOND EMBODIMENT

FIGS. 3A to 3D are cross sectional views showing, in sequential order, processes for manufacturing a semiconductor device according to the second embodiment. In the illustrations, the same reference numeral represents the same component shown in FIGS. 1A to 1D. The same processes as those described in the first embodiment will not be explained in this embodiment.

Figure 3A:
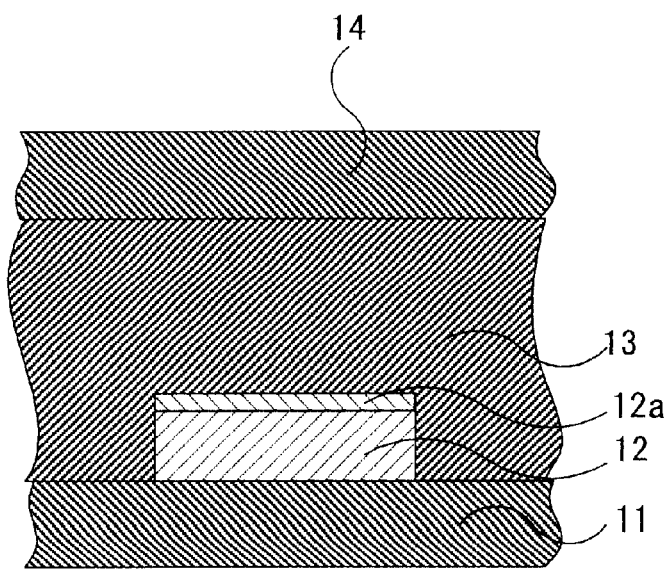
FIGS. 3A to 3D are diagrams showing, in sequential order, processes for manufacturing a semiconductor device according to the second embodiment of the present invention.

After the formation of the lower metal wiring 12 on the surface of which a TiN layer 12a is formed on the base insulating film 11, the base insulating film 11 and the lower metal insulating film 12 are coated with a liquid of a precursor monomer of a BCB resin in a thickness of 8 µm using a spin coating technique. After the BCB resin is pre-baked, it is baked at a temperature of 300° C., thereby forming the BCB film 13. As shown in FIG. 3A, the SiN film 14 which is approximately 0.3 µm in thickness is formed on the BCB film 13 using a plasma CVD technique.

Figure 3B:
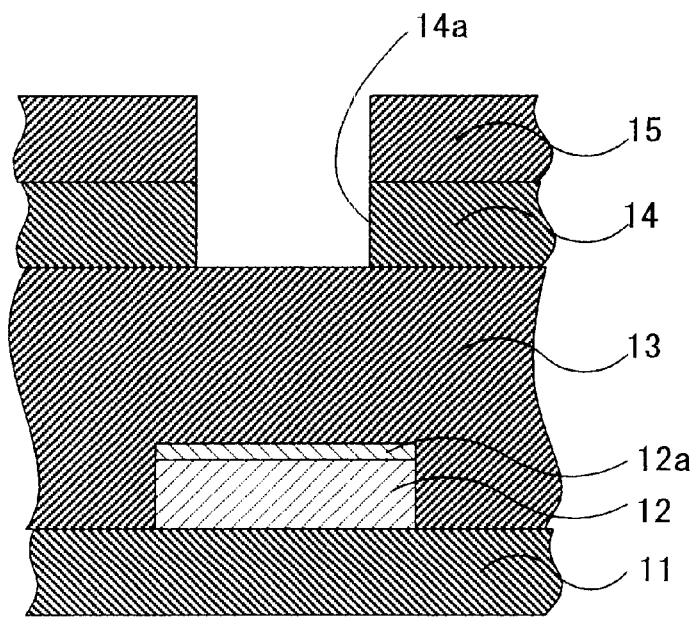

As illustrated in FIG. 3B, the resist film 15 which is 1 µm in thickness is formed, and the SiN film 14 is patterned using a dry etching technique, resulting in forming the opening 14a. Subsequently, $O_2$ ashing and wet etching using an organic solvent are performed, resulting in removing the resist film 15.

Figure 3C:
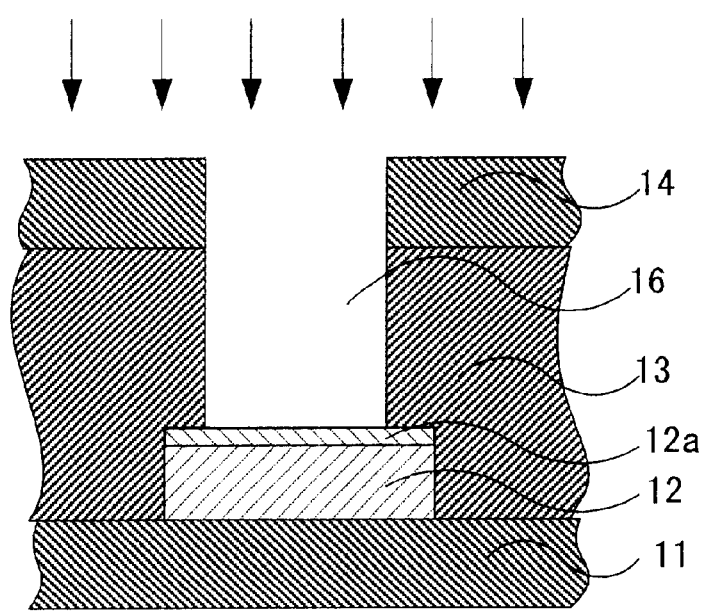
Figure 3D:
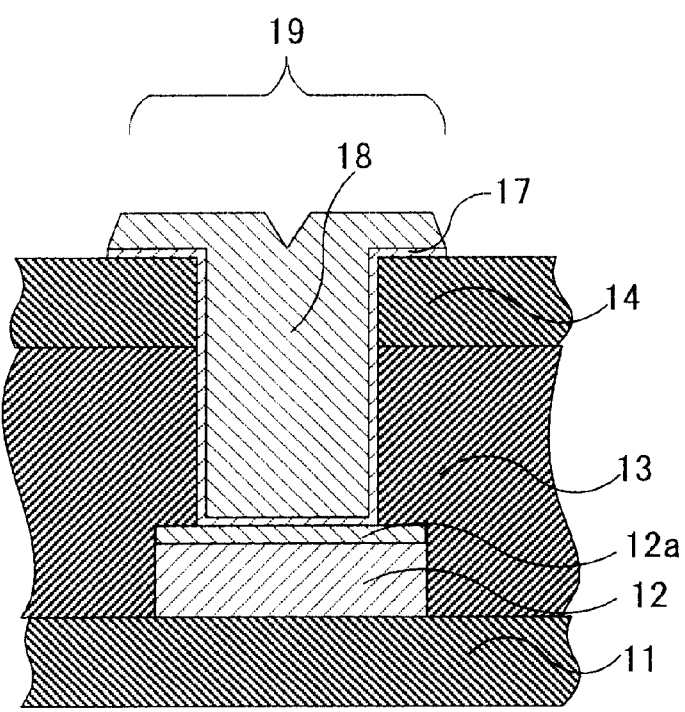
Figure 4:
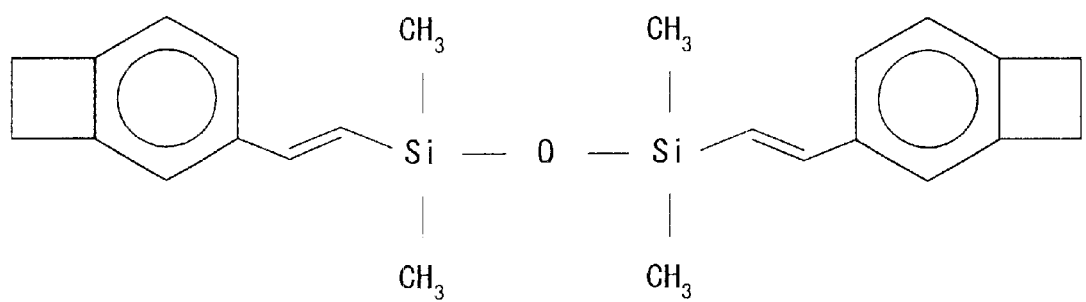
FIG. 4 is a diagram showing the structure of a BCB resin monomer.

As shown in FIG. 3C, the BCB film 13 is anisotropically dry-etched so as to form the contact hole 16, while using a mixture of $Cl_2/BCl_3/O_2$, in the ICP reactive furnace. After this, as shown in FIG. 3D, the upper metal wiring 19 including the contact metal layer 17 and the Au layer 18 is formed.

In the case where the BCB film 13 is dry-etched using a gas including $O_2$ the TiN layer 12a is hardly etched so that an oxide of Ti is formed on the surface, and serves as an etching stopper of the lower metal wiring 12. Accordingly, it is preventable that the thickness of the metal layer decreases and the reaction products are again attached to the side wall of the contact hole as caused by a reduction in the thickness of the film. Therefore, the desired contact characteristics can be obtained.

As explained above, according to the method of manufacturing a semiconductor device of the second embodiment, the same effects and advantages as those described in the first embodiment can be obtained. Further, the TiN layer 12a is formed on the lower metal wiring 12, resulting in forming a semiconductor device with high reliability.

In the first and second embodiments, any layer including Ti can be employed as the TiN layer 12a. A Ti layer, a TiSi layer or the like can be employed in place of the TiN layer 12a. The TiN layer may be formed only on an area corresponding to the contact hole, etc., instead of the entire surface of the lower metal wiring. In any case, it is preferred that the thickness of the TiN layer is equal to or larger than 25 nm so that the TiN layer can have a function as an etching stopper.

In the first and second embodiments, the BCB film is used as an interlayer insulating film. However, the interlayer insulating film is not limited to the BCB film, and any other organic insulating film, such as MSQ compounds (Methyl Silsesquioxane) or the like, having C and Si as major elements, can be used.

In the above-described embodiments, the ICP (Inductive Coupled Plasma) reactive furnace is used for etching the BCB film. However, the present invention can be applied to other type of plasma processing apparatus, such as an ECR (Electron Cyclotron Resonance) type, a helicon wave type plasma processing apparatus, etc.

In the above-described embodiments, a $SiO_2$ film or a SiN film has been employed as a mask for patterning the BCB film. However, any other film, such as a SiC film, etc., can be adopted, as long as the film has a sufficient selective ratio with respect to the BCB film.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. A method of manufacturing a semiconductor device, comprising:

forming an organic insulating film on a substrate;

forming a mask on the organic insulating film; and etching the organic insulating film through the mask so as to form an opening, using an etching gas including $Cl_2$, $BCl_3$ and $O_2$, wherein the organic insulating film includes a silsesquioxane compound.

2. The method of manufacturing a semiconductor device according to claim 1, wherein the organic insulating film is formed of an organic material including C and Si as elements greater than 50 weight percent.

3. A method of manufacturing a semiconductor device comprising:

forming an organic insulating film on a substrate;

forming a mask on the organic insulating film; and etching the organic insulating film through the mask so as to form an opening, using an etching gas including $Cl_2$, $BCl_3$ and $O_2$, wherein the organic insulating film includes a benzocyclobutene resin.

4. The method of manufacturing a semiconductor device according to claim 3, wherein the mask includes a SiO2 film or a SiN film.

5. The method of manufacturing a semiconductor device according to claim 3, wherein a lower wiring layer is formed below a bottom section of the opening; and at least one part of the lower wiring layer being in contact with the bottom section of the opening is formed of a conductive material which is etched at an etching rate of at least 30 nm/min against a $BCl_3$ gas ratio in the range of 0–30 percent.

6. The method of manufacturing a semiconductor device according to claim 5, wherein the conductive material is Ti, TiN or TiSi.

7. The method of manufacturing a semiconductor device according to claim 5, wherein the conductive material is equal to or larger than 25 nm in thickness.

8. The method of manufacturing a semiconductor device according to claim 3, wherein a percentage of $BCl_3$ within the etching gas is in a range between 5% and 80% by volume.

9. The method of manufacturing a semiconductor device according to claim 3, wherein a percentage of $O_2$ within the etching gas is in a range between 20% and 85% by volume.

10. The method of manufacturing a semiconductor device according to claim 3, wherein a percentage of $Cl_2$ within the etching gas is in a range between 10% and 80% by volume.

11. The method of manufacturing a semiconductor device according to claim 3, wherein the etching is performed using an ICP (Inductive Coupled Plasma) etching technique.

12. The method of manufacturing a semiconductor device, comprising:

forming an insulating film on a substrate;

forming a mask on the insulating film; and etching the insulating film through the mask so as to form an opening, using an etching gas including $Cl_2$, $BCl_3$ and $O_2$, wherein said insulating film comprises one of an organosilicon compound and a silsesquioxane compound, wherein said silsesquioxane compound includes a hydrogen silsesquioxane.

13. A method of manufacturing a semiconductor device, comprising:

forming an insulating film on a substrate;

forming a mask on the insulating film; and etching the insulating film through the mask so as to form an opening, using an etching gas including $Cl_2$, $BCl_3$ and $O_2$, wherein said insulating film comprises one of an organosilicon compound and a silsesquioxane compound, wherein the insulation film is formed of an organic material including C and Si as the compositional elements which are greater than 50 weight percent.

14. The method of manufacturing a semiconductor device according to claim 1, wherein:

a lower wiring layer is formed below a bottom section of the opening; and at least one part of the lower wiring layer being in contact with the bottom section of the opening is formed of a conductive material which is etched at a rate of at least 30 nm/min using the etching gas.

15. The method of manufacturing a semiconductor device, comprising:

forming an organic insulating film on a substrate;

forming a mask on the organic insulating film; and etching the organic insulating film through the mask so as to form an opening, using an etching gas including $Cl_2$, $BCl_3$ and $O_2$, wherein the organic insulating film is formed of an organic material having C and Si as the main compositional elements, and said organic material includes a benzocyclobutene resin.

* * * * *